United States Patent [19]

Osada et al.

[11] Patent Number: 5,525,428

[45] Date of Patent: *Jun. 11, 1996

[54] SUBSTRATE FOR SEMICONDUCTOR APPARATUS

[75] Inventors: Mituo Osada; Yoshinari Amano; Nobuo Ogasa; Akira Ohtsuka, all of Itami, Japan

[73] Assignee: Sumitomo Electric Industries, Ltd., Osaka, Japan

[ * ] Notice: The term of this patent shall not extend beyond the expiration date of Pat. No. 5,086,333.

[21] Appl. No.: 368,657

[22] Filed: Jan. 4, 1995

Related U.S. Application Data

[62] Division of Ser. No. 284,277, Aug. 2, 1994, Pat. No. 5,409,864, which is a continuation of Ser. No. 82,812, Jun. 28, 1993, abandoned, which is a continuation of Ser. No. 717,462, Jun. 17, 1991, abandoned, which is a division of Ser. No. 382,056, Jul. 13, 1989, Pat. No. 5,086,333, which is a continuation of Ser. No. 90,392, Aug. 27, 1987, abandoned, which is a continuation of Ser. No. 831,124, Feb. 21, 1986, abandoned, which is a continuation of Ser. No. 515,890, Jul. 21, 1983, abandoned.

[30] Foreign Application Priority Data

Jul. 26, 1982 [JP] Japan ................... 57-131026

[51] Int. Cl.$^6$ .................................................. B22F 7/04
[52] U.S. Cl. ...................... 428/546; 428/552; 257/684; 257/729; 257/712; 257/717; 437/209; 437/247
[58] Field of Search ................... 257/684, 729; 357/45, 67, 71, 81; 437/209, 247; 428/546, 552

[56] References Cited

U.S. PATENT DOCUMENTS

| | | | |
|---|---|---|---|
| 1,552,184 | 9/1925 | Adams . | |
| 1,848,437 | 3/1932 | Sieger et al. . | |
| 1,860,793 | 5/1932 | Weiger . | |
| 2,763,822 | 9/1956 | Frola et al. | 317/234 |
| 2,971,251 | 2/1961 | Willemse | 29/195 |
| 3,097,329 | 7/1963 | Siemens | 317/234 |
| 3,204,158 | 8/1965 | Schreiner et al. | 357/67 |
| 3,423,821 | 1/1969 | Zdanuk et al. | 75/208 |
| 3,969,754 | 7/1976 | Kuniya et al. | 357/65 |
| 4,025,997 | 5/1977 | Gernitis et al. | 428/621 |
| 4,196,442 | 4/1980 | Kuniya et al. | 357/67 |
| 4,340,902 | 7/1982 | Honda et al. | 357/74 |
| 4,427,993 | 1/1984 | Fichot et al. | 357/81 |
| 4,451,540 | 5/1984 | Baird et al. | 428/615 |
| 4,556,899 | 12/1985 | Kurihara et al. | 357/80 |
| 4,680,618 | 7/1987 | Kuroda et al. | 357/74 |
| 5,086,333 | 2/1992 | Osada et al. | 357/67 |
| 5,099,310 | 3/1992 | Osada et al. | 357/81 |
| 5,409,864 | 4/1995 | Osada et al. | 437/209 |

FOREIGN PATENT DOCUMENTS

| | | |
|---|---|---|
| 1143588 | 2/1963 | Germany . |
| 2853951 | 7/1980 | Germany . |
| 50-62776 | 5/1975 | Japan . |
| 56-030092 | 3/1981 | Japan . |
| 57-152438 | 9/1982 | Japan . |
| 58-067049 | 4/1983 | Japan . |
| 857569 | 12/1960 | United Kingdom . |
| 931820 | 7/1963 | United Kingdom . |

OTHER PUBLICATIONS

Meyer, "How to Select Electrical Contacts", *Metal Progress*, US, vol. 88, Jun. 1965—Dec. 1965, pp. 92–95.
Yih and Wang, *Tungsten, Sources, Metallurgy, Properties and Applications*, New York and London, 1979, pp. 362–363.
Shinbun, *Powder Metallurgy and Sintered Materials*, Japan, 1964, pp.264–267.
Benesovsky, *Powder Metallurgy and Sintered Materials*, Metallwerk Plansee AG & Co. KG, Germany, 1973, pp. 146–156.
*ELMET Contact Materials*, Metallwerk Plansee AG & Co., Germany, 1977.
Benesovsky, *Powder Metallurgy and Sintered Materials*, Metallwerk Plansee AG & Co., Germany, 1973, pp. 10–11.
*Elkonite Data Book*, P. R. Mallory & Co., Indianapolis, Ind., 1941, pp. 1–30.
*Resistance Welding Data Book*, P. R. Mallory & Co., Indianapolis, Ind., 1951, pp. 308–309.
*Mallory Catalog*, P. R. Mallory & Co., Indianapolis, Ind., 1950, pp. 30–33.
*Mallory Product Guide*, P. R. Mallory & Co., Indianapolis, Ind., 1962, p. 22.
*Elkonite Refractory Metal Composites Catalog*, P. R. Mallory & Co., Indianapolis, Ind., 1962.
*Elkonite Refractory Metal Composites Catalog*, P. R. Mallory & Co., Indianapolis, Ind., 1968.
*Elkonite Catalog*, Contact Metals Welding Inc., Indianapolis, Ind. 1981, pp. 308–309.
*Thermkon Catalog*, Contact Metals Welding Inc., Indianapolis, Inc., 1982 (Copyright Registration Sep. 27, 1982).
Thermkon Trademark Registration No. 1,354,948, Aug. 20, 1985.
*Thermkon Catalog*, Contact Metals Welding Inc., Indianapolis, Ind., 1987.
German, *Liquid Phase Sintering*, NY and London, 1985, pp. 160–163.
Jones, *Fundamentals Principles of Powder Metallurgy*, London, 1960, pp. 504–509, 770–773.
Sands et al., *Powder Metallurgy Practice and Applications*, London, 1966, pp. 94–95.
Kosco, "New Low Expansion Alloys for Semiconductor Applications", *Solid State Technology*, Jan., 1969, pp. 47–49.
Hirschhorn, *Introduction to Powder Metallurgy*, NY, 1969, pp. 244–245.

*Primary Examiner*—Charles T. Jordan
*Assistant Examiner*—Daniel J. Jenkins
*Attorney, Agent, or Firm*—Foley & Lardner

[57] ABSTRACT

This invention relates to a substrate for semiconductor apparatus loading a semiconductor chip in an integrated circuit apparatus and is characterized in that a sintered compact containing copper of 2 to 30 wt. % in tungsten and/or molybdenum is used as the substrate having the heat radiation capable of efficiently radiating heat developed from the loaded semiconductor chip and thermal expansion coefficient similar to those of semiconductor chip and other enclosure material except for the substrate.

17 Claims, No Drawings

SUBSTRATE FOR SEMICONDUCTOR APPARATUS

This application is a divisional of application Ser. No. 08/284,277, filed Aug. 2, 1994, now U.S. Pat. No. 5,409,864, which is a continuation of application Ser. No. 08/082,812, filed Jun. 28, 1993, now abandoned, which is a continuation of application Ser. No. 07/717,462, filed Jun. 17, 1991, now abandoned, which is a divisional of application Ser. No. 07/382,056, filed Jul. 13, 1989, now U.S. Pat. No. 5,086,333, which is a continuation of application Ser. No. 07/090,392, filed Aug. 27, 1987, now abandoned, which is a continuation of application Ser. No. 06/831,124, filed Feb. 21, 1986, now abandoned, which is a continuation of application Ser. No. 06/515,890, filed Jul. 21, 1983, now abandoned.

This invention relates to a substrate for mounting a semiconductor chip used in an integrated circuit or the like. An object of the invention is to provide a superior substrate for mounting the semiconductor chip, which is capable of efficiently radiating heat developed from the mounted semiconductor chip and has the substrate having a thermal expansion coefficient similar to those of semiconductor chip and material of other materials surrounding the same.

Substrates for mounting semiconductor chip have conventionally been made of a Ni alloy consisting of Kovar (29% Ni–17% Co–Fe), 42 alloy; etc. or ceramics, such as alumina, forsterite, etc. The conventional substrates have thermal expansion coefficients similar to that of the semiconductor chip, and when high heat radiation is also required, various Cu alloys have been used.

However, recent remarkable progress in the semiconductor industry has promoted greater size of semiconductor chips or increased amounts of heat generation and the demand for a substrate material to meet both the characteristics of thermal expansion coefficient and heat radiation has been on the increase.

Under such conditions, tungsten, molybdenum, beryllia, etc., have been proposed as materials to meet both of the above characteristics.

Beryllia, however, in fact is not usable from the standpoint of environmental pollution. Although the thermal expansion coefficient of tungsten or beryllia corresponds well to that of the semiconductor chip, it has a large difference from that of alumina often used as the enclosure material and also from that of GaAs which has been used in increasing amounts for semiconductor chips. Furthermore tungsten and molybdenum are inferior to beryllia in heat radiation so as to be largely restricted in the packaging design.

The inventors, after conducting research on elimination of the above defects in materials for conventional substrates for mounting semiconductor chips to thereby control a thermal expansion coefficient and obtain a substrate material of good heat conductivity, have arrived at the present invention.

In other words, the semiconductor chip bearing substrate has a thermal expansion coefficient similar to those of semiconductor chips and enclosure materials, and is superior in heat conductivity. It comprises a sintered compact containing copper at 2 to 30% and tungsten and/or molybdenum.

When the electrical insulated is required, the substrate is given a thin-layer surface coating of a ceramic or organic insulator, instead of conventional ceramic.

In this invention, there is employed Cu in the amount of 2 to 30 wt. % and W and/or Mo to obtain a thermal expansion coefficient of the substrate as similar as possible to those of Si and GaAs or sintered alumina or other enclosure materials, thereby reducing, to the extent possible, the influence of stress caused by the mismatch between the thermal expansion coefficients of the substrate and semiconductor chip and enclosure material. Hence, a proper amount of Cu need only be selected in the above range corresponding to the formation and size of the package.

This inventive substrate containing Cu and W and/or Mo is produced by powder metallurgy, because the manufacture of the same by the melting method is difficult due to the melting point and specific gravity difference between Cu, W and Mo. Among the powder metallurgy methods, the sintering and infiltration are preferable.

Also, it is possible to make the W and/or Mo skeleton by adding thereto an iron group element at 20 wt. % or less.

A preferable amount of iron group element to be added is below 5 wt. % when, but even above that, when up to 20 wt. %, will form the skeleton.

The addition of an amount over 20 wt. %, however, is not preferred because the sintered compact produced is defective in the thermal characteristics and thus will not attain the objects of the invention.

The amount of iron group element, even when added to both W and Mo, can be added to W or Mo independently.

As seen from the above, the substrate of the invention can meet the increasing demand for large and high density semiconductor chip and be applicable as a substrate for the GaAs chip which is being put into practical use together with an Si chip.

Next, embodiments of the invention will be detailed as follows.

EXAMPLE 1

Tungsten and a powder mixture of the same and an iron group element were compacted in the size of 100×100×5 mm respectively, and sintered under an $H_2$ gas atmosphere at a temperature of 1000° to 1400° C., thereby obtaining an intermediate sintered compact with porosity of 1 to 50%. Cu was infiltrated into the sintered compact under the $H_2$ gas atmosphere at a temperature of 1200° C. to produce Cu—W alloy of Cu content of 1 to 40 wt. %.

The Cu—W alloy thus produced was measured for thermal expansion coefficient and thermal conductivity to obtain the results in Table 1.

In addition, the thermal expansion coefficients of $Al_2O_3$, Si, and GaAs were entered therein.

The marks * in Table 1 represent comparison examples outside the scope of the invention.

TABLE 1

| No. | Alloy Composition | Thermal Expansion Coefficient ($\times 10^{-6}$/°C.) | Thermal Conductivity (cal/cm. sec. °C.) |
|---|---|---|---|
| 1* | 1Cu—99W | 4.7 | 0.40 |
| 2 | 5Cu—95W | 5.2 | 0.45 |
| 3 | 10Cu—90W | 7.0 | 0.50 |
| 4 | 15Cu—85W | 7.9 | 0.54 |
| 5 | 20Cu—80W | 8.3 | 0.58 |
| 6 | 25Cu—75W | 9.0 | 0.62 |
| 7 | 30Cu—70W | 9.7 | 0.65 |
| 8* | 35Cu—65W | 11.0 | 0.69 |
| 9* | 40Cu—60W | 11.8 | 0.73 |

TABLE 1-continued

| No. | Alloy Composition | Thermal Expansion Coefficient (×10⁻⁶/°C.) | Thermal Conductivity (cal/cm. sec. °C.) |
|---|---|---|---|
| 10 | 10Cu—89W—1Ni | 7.0 | 0.48 |
| 11 | 20Cu—79.5W—0.5Ni | 8.2 | 0.57 |
| 12 | 5Cu—80W—15Fe | 7.9 | 0.42 |
| 13 | 10Cu—79W—11Co | 8.1 | 0.46 |
| 14* | $Al_2O_3$ | 7.2 | |
| 15* | Si | 4.0 | |
| 16* | GaAs | 6.7 | |

In the above table, IC package using Cu—W alloy sintered compact (No. 3) of Cu content of 10 wt. % as the substrate material for mounting an Si chip produced no heat distortion due to a small difference between the thermal expansion coefficients of Si chip and other enclosure base materials of $Al_2O_3$ during the mounting process and an extremely good heat radiation and the device could produce an IC longer in life span and of high reliability.

EXAMPLE 2

Molybdenum and a powder mixture of the same and iron group element were compacted in the size of 100×100×5 mm respectively, and then were sintered under an $H_2$ gas atmosphere at a temperature of 1000° to 1400° C., thereby obtaining an intermediate sintered compact with a porosity of 1 to 50%.

Copper was infiltrated into the intermediate sintered compact under an $H_2$ gas atmosphere at a temperature of 1200° C., thereby producing a Cu—Mo alloy of copper content of 1 to 50 wt. %.

The Cu—Mo alloy thus produced was measured for the thermal expansion coefficient and heat conductivity, thereby having obtained the results in Table 2.

In addition, the marks * show comparison examples outside of the scope of the invention.

TABLE 2

| No. | Alloy Composition | Thermal Expansion Coefficient (×10⁻⁶/°C.) | Thermal Conductivity (cal/cm. sec. °C.) |
|---|---|---|---|
| 1* | 1Cu—99Mo | 5.3 | 0.35 |
| 2 | 5Cu—95Mo | 5.9 | 0.38 |
| 3 | 10Cu—90Mo | 6.5 | 0.41 |
| 4 | 15Cu—85Mo | 7.1 | 0.44 |
| 5 | 20Cu—80Mo | 7.9 | 0.48 |
| 6 | 25Cu—75Mo | 8.4 | 0.50 |
| 7 | 30Cu—70M0 | 9.1 | 0.54 |
| 8* | 35Cu—65Mo | 9.7 | 0.57 |
| 9* | 40Cu—60Mo | 10.3 | 0.60 |
| 10* | 50Cu—50Mo | 11.5 | 0.66 |
| 11 | 10Cu—89.5Mo—0.5Ni | 6.5 | 0.39 |
| 12 | 15Cu—82.0Mo—3.0Ni | 7.2 | 0.41 |
| 13 | 5Cu—78Mo—17Fe | 8.2 | 0.36 |
| 14 | 10Cu—82Mo—8Co | 7.8 | 0.40 |

In the above table 2, an IC package using a Cu—Mo alloy sintered compact (No. 4) as the substrate base material for mounting an Si chip produced no heat distortion at all due to a small difference between the thermal expansion coefficients of the Si chip and other enclosure base materials of $Al_2O_3$ during the mounting process and an extremely good heat radiation and the device could obtain an IC longer in life span and of high reliability.

EXAMPLE 3

Tungsten, molybdenum powder or tungsten—molybdenum alloy powder and the required amounts of copper powder and iron group powder were mixed as shown in Table 3, and the powder was mixed by an attrition mixer uniformly for three hours, compacted to the size of 30×30×5 mm under pressure of 1 t/cm², and then sintered under the $H_2$ gas atmosphere at a temperature of 1450° C. for one hour.

The alloy thus produced was measured for thermal expansion coefficient and heat conductivity, with the results set forth in Table 3. In addition, in Table 3, the marks * represent comparative examples outside the scope of the invention.

TABLE 3

| No. | Alloy Composition | Thermal Expansion Coefficient (×10⁻⁶/°C.) | Thermal Conductivity (cal/cm. sec. °C.) |
|---|---|---|---|
| 1 | 15Cu—85W | 8.2 | 0.50 |
| 2 | 20Cu—79W—1Ni | 8.5 | 0.48 |
| 3 | 20Cu—75W—5Co | 8.7 | 0.47 |
| 4 | 30Cu—68W—2Fe | 9.9 | 0.50 |
| 5 | 20Cu—70W—10Mo | 8.5 | 0.54 |
| 6* | 35Cu—65W | 11.5 | 0.61 |

What is claimed is:

1. A semiconductor package for a semiconductor chip, comprising:
   (a) a first member consisting essentially of alumina and forming an enclosure material for said semiconductor package;
   (b) a second member made by a powder metallurgical method, wherein the powder metallurgical method comprises one of the steps of:
      (1) mixing tungsten, molybdenum, or tungsten and molybdenum, and copper powders, forming a mixed powder compact and sintering said mixed powder compact at a temperature higher than the melting point of copper, and
      (2) forming tungsten powder, molybdenum powder, or a mixture thereof into a powder compact, sintering said powder compact to form a sintered compact, and infiltrating said sintered compact with molten copper;

wherein said second member has a copper content within the range of 5–20 percent by weight.

2. A semiconductor package as recited in claim 1, wherein said powder metallurgical method is defined by step (2).

3. A package for a semiconductor chip comprising:
   (a) an alumina member enclosing said semiconductor chip; and
   (b) a heat radiation member comprising 80–90 percent by weight of preselected material selected from the group consisting of at least one of tungsten and molybdenum in the form of a sintered compact, and 10–20 percent by weight of copper, said heat radiation member being made by forming tungsten powder, molybdenum powder, or a mixture thereof into a powder compact, sintering said powder compact to form a sintered compact, and infiltrating said sintered compact with molten copper.

4. A package for a semiconductor chip, said package made by the process of:
   (a) providing a first member consisting essentially of alumina;

(b) producing a second member by a powder metallurgical method, wherein the powder metallurgical method comprises one of the steps of:

(1) mixing tungsten, molybdenum, or tungsten and molybdenum, and copper powders, forming a mixed powder compact and sintering said mixed powder compact at a temperature higher than the melting point of copper, and (2) forming tungsten powder, molybdenum powder, or a mixture thereof into a powder compact, sintering said powder compact to form a sintered compact, and infiltrating said sintered compact with molten copper;

(c) selecting a copper content within the range of 5–20 percent by weight; and (d) packaging said integrated circuit with said first and second members.

5. A package for a semiconductor chip as recited in claim 4, wherein said powder metallurgy method is defined by step (2).

6. A package for a semiconductor device, said package comprising a first member comprising alumina and a second member of composite material comprising by weight of about 5 to 30% of copper portion and from 95 to 70% of a preselected material selected from the group consisting of tungsten and molybdenum in the form of a porous block, said porous block having been impregnated with said copper portion from the molten state of said copper.

7. A package for a semiconductor chip comprising:

(a) an alumina member enclosing said semiconductor chip; and (b) a heat radiation member comprising 70–95 percent by weight of preselected material selected from the group consisting of at least one of tungsten and molybdenum in the form of a sintered compact, and 5–30 percent by weight of copper.

8. A package for a semiconductor chip as recited in claim 7, wherein said copper is infiltrated into said sintered compact.

9. A package for a semiconductor chip as recited in claim 8, wherein said copper is infiltrated at about 1200° C. in a hydrogen atmosphere.

10. A package for a semiconductor chip as recited in claim 7, wherein said semiconductor chip is one of Si and GaAs.

11. A package for a semiconductor chip comprising:

(a) a first member consisting essentially of alumina and enclosing said semiconductor chip; and (b) a second member comprising 80–95 percent by weight of preselected material selected from the group consisting of at least one of tungsten and molybdenum in the form of a sintered compact and having a copper content of 5–20 percent by weight.

12. A package for a semiconductor device, said package comprising a first member consisting essentially of alumina and a second member of composite material comprising by weight of about 5 to 30% of copper portion and from 95 to 70% of a preselected material selected from the group consisting of tungsten and molybdenum in the form of a porous block, said porous block having been impregnated with said copper portion from the molten state of said copper.

13. A package for a semiconductor chip comprising:

(a) an alumina member enclosing said semiconductor chip; and (b) a heat dissipation member comprising 80–90 percent by weight of preselected material selected from the group consisting of at least one of tungsten and molybdenum in the form of a sintered compact, and 10–20 percent by weight of copper, said heat dissipation member being made by forming tungsten powder, molybdenum powder, or a mixture thereof into a powder compact, sintering said powder compact to form a sintered compact, and infiltrating said sintered compact with molten copper.

14. A package for a semiconductor chip comprising:

(a) an alumina member enclosing said semiconductor chip; and (b) a heat dissipation member comprising 70–95 percent by weight of preselected material selected from the group consisting of at least one of tungsten and molybdenum in the form of a sintered compact, and 5–30 percent by weight of copper.

15. A package for a semiconductor chip as recited in claim 14, wherein said copper is infiltrated into said sintered compact.

16. A package for a semiconductor chip as recited in claim 15, wherein said copper is infiltrated at about 1200° C. in a hydrogen atmosphere.

17. A package for a semiconductor chip as recited in claim 14, wherein said semiconductor chip is one of Si and GaAs.

* * * * *

US005525428B1

REEXAMINATION CERTIFICATE (3470th)

United States Patent [19]

Osada et al.

[11] B1 5,525,428

[45] Certificate Issued  *Mar. 24, 1998

[54] SUBSTRATE FOR SEMICONDUCTOR APPARATUS

[75] Inventors: Mituo Osada; Yoshinari Amano; Nobuo Ogasa; Akira Ohtsuka, all of Itami, Japan

[73] Assignee: Sumitomo Electric Industries, Ltd., Osaka, Japan

[*] Notice: The term of this patent shall not extend beyond the expiration date of Pat. No. 5,086,333.

Reexamination Request:
No. 90/004,487, Dec. 18, 1996

Reexamination Certificate for:
Patent No.: 5,525,428
Issued: Jun. 11, 1996
Appl. No.: 368,657
Filed: Jan. 4, 1995

Related U.S. Application Data

[62] Division of Ser. No. 284,277, Aug. 2, 1994, Pat. No. 5,409,864, which is a continuation of Ser. No. 82,812, Jun. 28, 1993, abandoned, which is a continuation of Ser. No. 717,462, Jun. 17, 1991, abandoned, which is a division of Ser. No. 382,056, Jul. 13, 1989, Pat. No. 5,086,333, which is a continuation of Ser. No. 90,392, Aug. 27, 1987, abandoned, which is a continuation of Ser. No. 831,124, Feb. 21, 1986, abandoned, which is a continuation of Ser. No. 515,890, Jul. 21, 1983, abandoned.

[30] Foreign Application Priority Data

Jul. 26, 1982 [JP] Japan .................................. 57-131026

[51] Int. Cl.⁶ ........................................................ B22F 7/04
[52] U.S. Cl. ...................... 428/546; 428/552; 257/684; 257/729; 257/712; 257/717; 437/209; 437/247
[58] Field of Search ..................... 428/546, 552; 257/684, 729, 712, 717; 437/209, 247

[56] References Cited

U.S. PATENT DOCUMENTS

| 3,409,974 | 11/1968 | Lueck et al. | 29/420.5 |
| 3,423,203 | 1/1969 | Zdanuk et al. | 75/208 |
| 4,340,902 | 7/1982 | Honda et al. | 357/74 |
| 4,556,899 | 12/1985 | Kurihara et al. | 357/80 |
| 4,680,618 | 7/1987 | Kuroda et al. | 357/74 |
| 4,788,627 | 11/1988 | Ehlert et al. | 361/386 |
| 5,086,333 | 2/1992 | Osada et al. | 357/67 |
| 5,099,310 | 3/1992 | Osada et al. | 357/81 |
| 5,409,864 | 4/1995 | Osada et al. | 437/209 |

FOREIGN PATENT DOCUMENTS

| 52-59572 | 5/1977 | Japan . |
| 857569 | 12/1960 | United Kingdom . |

OTHER PUBLICATIONS

*McGraw–Hill Dictionary of Scientific and Technical Terms* 299, 399, 2154 (5th ed. 1994).

*Elkonite® Series 200 Catalog,* 200, 201:1–4, 205:1–4, 210:1–2 215:1–2, 220:1–2, 225:1, 230:1, 235:1–3, 240:1, published in Oct. 1979 by CMW Inc.

*McGraw–Hill Concise Encyclopedia of Science and Technology* 478 (3d ed. 1994).

*Primary Examiner*—Daniel J. Jenkins

[57] ABSTRACT

This invention relates to a substrate for semiconductor apparatus loading a semiconductor chip in an integrated circuit apparatus and is characterized in that a sintered compact containing copper of 2 to 30 wt. % in tungsten and/or molybdenum is used as the substrate having the heat radiation capable of efficiently radiating heat developed from the loaded semiconductor chip and thermal expansion coefficient similar to those of semiconductor chip and other enclosure material except for the substrate.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3, 4, 6, 7, 11, 12, 13 and 14 are determined to be patentable as amended.

Claims 2, 5, 8, 9, 10, 15, 16 and 17 dependent on an amended claim, are determined to be patentable.

1. A semiconductor package for a semiconductor chip, comprising:
   (a) a first member consisting essentially of alumina and forming an enclosure material for said semiconductor package;
   (b) a second member made by a powder metallurgical method, wherein the powder metallurgical method comprises one of the steps of:
      (1) mixing tungsten, molybdenum, or tungsten and molybdenum, and copper powders, forming a mixed powder compact and sintering said mixed powder compact at a temperature higher than the melting point of copper, and
      (2) forming tungsten powder, molybdenum powder, or a mixture thereof into a powder compact, sintering said powder compact to form a sintered compact, and infiltrating said sintered compact with molten copper;
   *wherein the powder metallurgical method does not include a rolling step after the sintering step in case of said step (1) and after the infiltrating step in case of said step (2), and*
   wherein said second member has a copper content within the range of 5–20 percent by weight.

3. A package for a semiconductor chip comprising:
   (a) an alumina member enclosing said semiconductor chip; and
   (b) a heat radiation member comprising 80–90 percent by weight of preselected material selected from the group consisting of at least one of tungsten and molybdenum in the form of a sintered compact, and 10–20 percent by weight of copper, said heat radiation member being made by forming tungsten powder, molybdenum powder, or a mixture thereof into a powder compact, sintering said powder compact to form a sintered compact, and infiltrating said sintered compact with molten copper, *wherein a rolling step is not included after the infiltrating step.*

4. A package for a semiconductor chip, said package made by the process of:
   (a) providing a first member consisting essentially of alumina;
   (b) producing a second member by a powder metallurgical method, wherein the powder metallurgical method comprises one of the steps of:
      (1) mixing tungsten, molybdenum, or tungsten and molybdenum, and copper powders, forming a mixed powder compact and sintering said mixed powder compact at a temperature higher than the melting point of copper, and
      (2) forming tungsten powder, molybdenum powder, or a mixture thereof into a powder compact, sintering said powder compact to form a sintered compact, and infiltrating said sintered compact with molten copper;
   *wherein the powder metallurgical method does not include a rolling step after the sintering step in case of said step (1) and after the infiltrating step in case of said step (2);*
   (c) selecting a copper content within the range of 5–20 percent by weight; and
   (d) packaging said integrated circuit with said first and second members.

6. A package for a semiconductor device, said package comprising a first member comprising alumina and a second member of composite material comprising by weight of about 5 to 30% of copper portion and from 95 to 70% of a preselected material selected from the group consisting of tungsten and molybdenum in the form of a porous block, said porous block having been impregnated with said copper portion from the molten state of said copper, *wherein said impregnated block is not subjected to a rolling step.*

7. A package for a semiconductor chip comprising:
   (a) an alumina member enclosing said semiconductor chip; and
   (b) a heat radiation member comprising 70–95 percent by weight of preselected material selected from the group consisting of at least one of tungsten and molybdenum in the form of a sintered compact, and 5–30 percent by weight of copper, *wherein said sintered compact is formed after a sintering step and is not subjected to a rolling step after the sintering step.*

11. A package for a semiconductor chip comprising:
    (a) a first member consisting essentially of alumina and enclosing said semiconductor chip; and
    (b) a second member comprising 80–95 percent by weight of preselected material selected from the group consisting of at least one of tungsten and molybdenum in the form of a sintered compact and having a copper content of 5–20 percent by weight, *wherein said sintered compact is formed after a sintering step and is not subjected to a rolling step after the sintering step.*

12. A package for a semiconductor device, said package comprising a first member consisting essentially of alumina and a second member of composite material comprising by weight of about 5 to 30% of copper portion and from 95 to 70% of a preselected material selected from the group consisting of tungsten and molybdenum in the form of a porous block, said porous block having been impregnated with said copper portion from the molten state of said copper, *wherein said impregnated block is not subjected to a rolling step.*

13. A package for a semiconductor chip comprising:
    (a) an alumina member enclosing said semiconductor chip; and
    (b) a heat dissipation member comprising 80–90 percent by weight of preselected material selected from the group consisting of at least one of tungsten and molybdenum in the form of a sintered compact, and 10–20 percent by weight of copper, said heat dissipation member being made by forming tungsten powder, molybdenum powder, or a mixture thereof into a powder compact, sintering said powder compact to form a sintered compact, and infiltrating said sintered compact with molten copper, *wherein a rolling step is not included after the infiltrating step*.

14. A package for a semiconductor chip comprising:

(a) an alumina member enclosing said semiconductor chip; and (b) a heat dissipation member comprising 70–95 percent by weight of preselected material selected from the group consisting of at least one of tungsten and molybdenum in the form of a sintered compact, and 5–30 percent by weight of copper, *wherein said sintered compact is formed after a sintering step and is not subjected to a rolling step after the sintering step*.

\* \* \* \* \*